United States Patent
Kadunce et al.

(10) Patent No.: US 6,280,821 B1
(45) Date of Patent: Aug. 28, 2001

(54) REUSABLE MASK AND METHOD FOR COATING SUBSTRATE

(75) Inventors: Randy R. Kadunce, New Kensington; Peter T. Dishart, Pittsburgh; Robert T. Shumaker, Jr., Manorville, all of PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 09/391,953

(22) Filed: Sep. 8, 1999

Related U.S. Application Data

(60) Provisional application No. 60/099,731, filed on Sep. 10, 1998.

(51) Int. Cl.[7] ............................. B32B 3/02; B05D 1/32; B05C 11/11
(52) U.S. Cl. .................. 428/157; 428/172; 428/192; 428/195; 427/259; 427/282; 118/504; 118/505
(58) Field of Search ................. 428/157, 172, 428/192, 195, 213; 427/259, 282; 118/504, 505

(56) References Cited

U.S. PATENT DOCUMENTS

| | | | |
|---|---|---|---|
| 4,820,902 | 4/1989 | Gillery | 219/203 |
| 4,849,766 | 7/1989 | Inaba et al. | 343/713 |
| 4,898,789 | 2/1990 | Finley | 428/623 |
| 5,083,135 | 1/1992 | Nagy et al. | 343/713 |
| 5,178,913 * | 1/1993 | Kusunoki et al. | 118/504 |
| 5,492,750 | 2/1996 | Shumaker, Jr. et al. | 428/192 |
| 5,654,074 * | 8/1997 | Smith | 428/120 |

* cited by examiner

Primary Examiner—Donald J. Loney
(74) Attorney, Agent, or Firm—Kenneth J. Stachel

(57) ABSTRACT

A mask article and method of coating are provided whereby coating is deleted from one or more portions of a substrate like transparencies during a coating operation. The mask is a semi-rigid device having two major generally opposing surfaces and one or more sides between such surfaces with at least one one-piece edge. The side(s) slope inward toward the interior of the solid part of the mask at an angle from the horizontal plane of the larger major surface of the mask up to the slope of the side from greater than 0° to less than 90°. This inward slope is somewhere along the side between the larger major surface and the smaller major surface. The sloping segment of the side should extend a distance sufficient to provide an adequate edge at the mask-coating-substrate interface to reduce the ghosting effect. The surface area of the larger area surface has the configuration of the shape of a deletion for the coating. The mask is adapted for secure placement on the substrate during the coating process and removal therefrom after the coating process. This is accomplished either by the weight of the mask itself or from the use of at least one friction enhancing member present on the mask. With the presence of friction enhancing member(s) on the mask, recesses are also optionally provided on the mask. The number, size, configuration and location of the recesses and friction enhancing members assist in the stackability of a plurality of the masks. After one or more coatings are applied to the masked substrate, the masks can be removed and conveyed to the beginning of coating operation to mask other substrates. After a number of such cycles the masks can be cleaned of coating and reused.

22 Claims, 2 Drawing Sheets

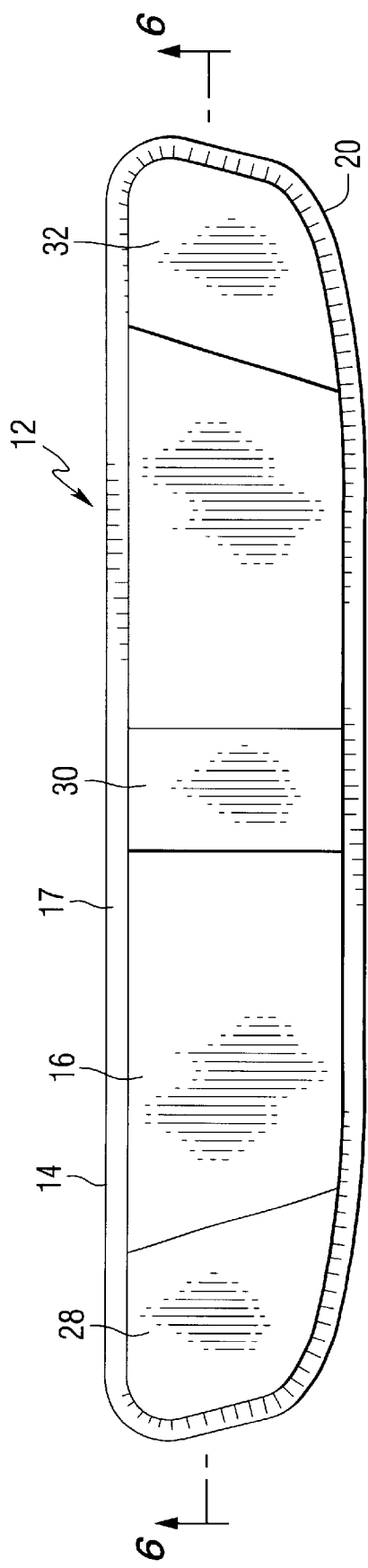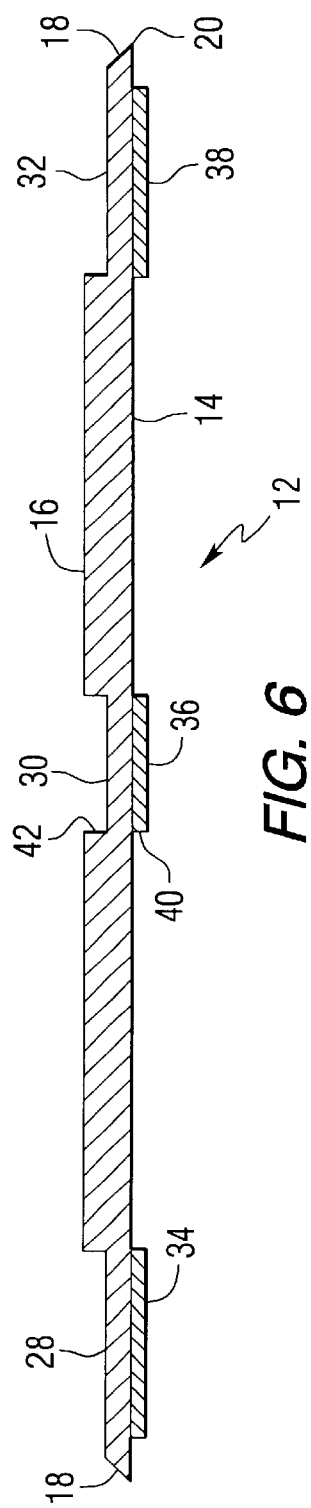

REUSABLE MASK AND METHOD FOR COATING SUBSTRATE

This application claims the benefit of U.S. Provisional Application No. 60/099,731, filed Sep. 10, 1998.

The present invention relates to a reusable mask used to prevent selected portions of a substrate like a glass-containing transparency from being coated with a film or coating whereby the appearance of the coating is improved.

Recent advances in automotive technology have resulted in novel multifunctional uses for vehicle transparencies. More specifically, windshields have been designed to incorporate heating arrangements, as disclosed in U.S. Pat. No. 4,820,902 to Gillery, and antenna systems, as disclosed in U.S. Pat. No. 4,849,766 to Inaba et al. and U.S. Pat. No. 5,083,135 to Nagy et al. These developments use a transparent metallic coating applied to selected portions of a major surface of the windshield glass in specific patterns. The coating may be applied using techniques well known in the art, e.g. physical vapor deposition techniques which include magnetic sputtering vacuum deposition (MSVD) and chemical vapor deposition techniques. One method used to form these patterns is to use tape to outline the desired coating configuration and protect selected portions of the glass sheets from being coated by the film. However, this procedure is time-consuming and labor intensive in both applying the tape before coating and removing the tape after coating. In addition, the tape cannot be reused and must be discarded after each use.

In U.S. Pat. No. 5,492,750 for a mask for coated glass by Shumaker et. al. a reusable mask for coating glass transparencies is disclosed. This mask has two members, sections, or portions to provide an edge where the mask meets the deposited coating on the glass substrate to reduce the ghosting effect of the coated glass. This "ghosting" condition is a visually observable change in the coloration of the coating where the coating/mask interface was and where the mask may have shaded the glass during coating. This ghosting effect may be reduced by reducing the thickness of the mask but as thickness is reduced, the rigidity of the mask is also reduced, resulting in increased difficulty in handling the mask. In addition, if the mask becomes too thin, it may be too light in weight to lay flush against the surface of the substrate, resulting in a poor quality edge outlining the coating. Any such edge of the mask should be durable to be reusable without sustaining nicks and breaks along the edge that would affect the appearance and performance of the coating in regards to ghosting. Furthermore, the mask may be too flimsy to be cleaned and reused in subsequent masking operations. The durability and longevity of such masks could be improved so that the masks can experience more cycles through the cleaning process to remove the coating from the surface of the mask that is exposed to the coating process.

Additionally recent developments in the use of transparencies on motor vehicles include telepeage for the automatic identification of vehicles and the recording of highway tolls. Signals used in télépéage for automatic toll collection need to traverse the transparency to communicate with a device in the motor vehicle. Some coatings on the transparencies can interfere with these signals so the transparencies need to have selected voids or deletions in the coating to permit the passing of signals such as electromagnetic signals to appropriate communication devices within the vehicle. Generally such deletions of the coating are separate or isolated from border deletions of the coating around the periphery of the transparency although such selected deletions could be part of the border deletion as long as the void in the coating allows sufficient area for the passage of the signals.

Generally the masks for obtaining the border deletions are larger than masks for the deletions for signal passage. When these smaller masks are isolated from the border masks in placement on the transparency during coating, the independent mask or masks should not move or shift very much during the coating process. Also as with the border masks it is desirable that any independent masks are reusable and can withstand as many cleaning cycles as possible to remove coating from the masks. Also the masks should allow for the reduction in ghosting of the coating on substrates like transparencies from the areas of the deletions that are in view or sight of the user or observer of the coated transparency.

It would be advantageous to have a reusable mask to provide deletions in coatings on substrates like transparencies that minimize ghosting along the periphery of the coating around the deletions and that can withstand numerous cycles through the cleaning process to remove the coating from the mask and additionally that have a simple construction and have improved durability.

SUMMARY OF THE INVENTION

The foregoing objects of the invention and other objects gleaned from the following disclosure are accomplished by the mask article and method of coating the substrate like transparencies with the mask of the present invention. The mask is a semi-rigid device having two major generally opposing surfaces and one or more sides between such surfaces with at least one one-piece edge. One of these surfaces is of a larger area than the other surface to provide for at least one of the sides that is involved as an edge in the substrate-mask-coating interface to have an inward sloping outline having an angle from the horizontal of one of the surfaces from greater than 0° to less than 90° somewhere along the side between the larger surface and the smaller surface. This distance along the side could be at the beginning of the side from the larger surface area or in the middle of the side between the larger and smaller surface areas as long as the distance from the larger surface area to the start of the sloping outline of the side is 0.03 inch (0.076 cm.) or less. The contour of the side with the sloping outline can be straight or curved as in a concave contour or a combination of these without any convex extensions past the sloping outline. Also this angle is measured from an imaginary vertex on the larger or smaller surface to the outermost extension of the side with the sloping outline. The sloping outline of the side should extend a distance sufficient to provide an adequate edge at the larger surface to reduce the ghosting effect. The larger area surface has the configuration of the shape of a deletion for the coating. The generally opposing smaller area surface can have the similar configuration allowing for the sloping or inclined outline of the one or more sides or any other general configuration that would assist in its use or placement on the substrate or coating.

The mask is adapted for secure placement on the substrate during the coating process and removal therefrom after the coating process. With the one or more sloping sides for the substrate-mask-coating interface, the thickness of the coating is more uniform from any planned or selected deletion. The secure placement of the mask during coating can be accomplished by the weight of the mask itself during horizontal or near horizontal coating of the substrate or from the use of at least one friction enhancing member present on the larger surface area of the mask. In mass production of the coated substrate, it can be convenient to stack the masks after coating of the substrates. Such a stack or stacks can be conveyed to the beginning of the coating line for reuse of the masks or to a periodic cleaning operation at some point in the process to remove coating from the non-substrate contacting surface of the mask. With the friction enhancing members present on the mask, removal of individual masks from the stack can be complicated. Therefore, optionally, the mask has recesses on the surface generally opposing the surface immediately adjacent to the substrate. These recesses in this surface generally match the number, shape and configuration of the friction enhancing member.

The method of applying a coating to a substrate utilizing the mask described above involves covering the substrate with the semi-rigid mask. The coverage is such that the surface of the mask having the configuration and shape matching that of the desired deletion in the coating faces the substrate or contacts the substrate. Also the inwardly sloping side or sides of the mask face in or point to the direction of where the deposited coating will be. After the mask or masks cover the substrate, the substrate is coated. The coated substrate can be further treated to provide some degree of permanency of the coating for handling and additional processing steps either before or after the masks are removed from the coated substrate. With its deletion shape, the mask inhibits the deposition of the coating on the substrate for the shape of the mask whereby the deposited coating has a more uniform thickness of the coating as the coating build lays away from the periphery of the deletion to reduce the ghosting effect from said coating. The removed masks are conveyed to the place of processing the substrates for reuse in coating other substrates. Optionally a plurality of the masks with at least one recess to match the at least one friction enhancing member of another mask can be stacked into a plurality of masks and are available for reuse in coating other substrates.

BRIEF DESCRIPTION OF THE DRAWINGS

FIG. 5 is a top plan view of a deletion mask for coating substrates where such a mask is independent of any border mask for covering the periphery of the substrate.

FIG. 6 is a side view of the independent type deletion mask of FIG. 5 where such mask generally can be placed anywhere a deletion is required on the substrate.

DETAILED DESCRIPTION OF THE INVENTION

In the description and the claims of this patent application the following terms have the following definition.

The term "transparency" useful as a substrate for the masks of the present invention can be a glass or plastic material or glass and plastic laminates or all plastic laminates that could be clear or have a tint or color but is still transparent. Here "transparent" means that at least some light, of any wavelength passes through the transparency, instead of being absorbed or reflected. For instance the transparency can be transparent to light of a range of wavelengths which includes at least some of the wavelengths in the visible range (wavelength from 4200 [Angstrom] to 7000 [Angstrom]). The transparent nature can vary to allow sight through the transparency as more sight is required for a windshield transparency than for a side window for a motor vehicle.

The term "shape" includes any type of geometric shape from a circular shape to an oval shape to a multi-sided shape.

The term "transparent coating" has a similar meaning in regards to transparent as that for transparency but the coating has this property.

Figure 1:
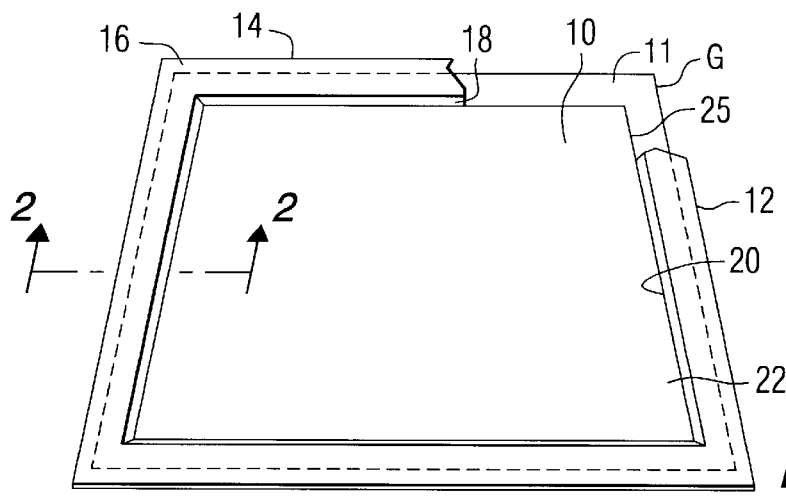
FIG. 1 is a cut-away plan view of a coated substrate and the border type deletion mask of the present invention.

FIG. 1 illustrates a glass sheet G with a coating 10 applied to selected portions of the sheet G. As shown in FIG. 1, mask 12 is used to cover portions of a flat substrate which generally has a larger surface area than 10 square inches. Although, it should be appreciated that mask 12 may also be curved to match and to mask selected portions of a shaped substrate such as a transparency. In addition, mask 12 may be used to mask other substrate materials both transparent and non-transparent. The shape of the coated area may be varied depending on the desired final use of the coated product. For example, in automotive applications, the substrate as a transparency may be a side or rear window or one of two plies used in an automotive windshield, with the coating being provided to improve the solar performance of the transparency. The coated transparency may incorporate bus bars and leads to form an electrically heatable transparency. The coated glass sheet G may also include electrical connectors of a type that would allow the coated sheet G to function as an antenna in an automobile or the like. The pattern of the coating may be modified to provide a radio, television, portable positioning system or other type of antenna systems. The present invention may also be used to produce architectural panels having specific coating patterns.

Referring to FIG. 1, coating 10 may be any type of coating, for example, a transparent multi-layered metallic coating as disclosed in U.S. Pat. No. 4,898,789 to Finley which is applied by magnetic sputtering vacuum deposition techniques which are well known in the art. Of course, any type of sputtered coating for glass known to those skilled in the art can be used. Mask 12, as an object of the present invention, is used to cover selected portions of a major surface of the substrate like glass sheet G about its periphery so that the coating 10 is applied in the predetermined pattern. The mask shown in FIG. 1 is used to coat the central portion of a substrate through the opening in the central portion of the mask while leaving the edge portions 11 uncoated. In addition it should be appreciated that the shape of the coating and the corresponding shape of the mask could be any desired configuration. For example, the mask may be used to form a coating with a series of slots or the mask may be used to cover an interior portion of a substrate while allowing the coating to extend to the edges of the substrate.

In FIG. 1, mask 12 has a major surface 14 with a larger surface area where the configuration of surface 14 closely matches the desired deletion shape for the void in the coating. Surface 14 is cut to a shape which generally approximates the area of the substrate to be covered. Another major surface 16 of mask 12 has a surface area smaller than that for surface 14 and generally is opposite the surface 14. These two surfaces 14 and 16 are attached by one or more sides 17. At least one of these sides 17, which is to face the coating so that it is coated, is at the mask-coatingsubstrate interface. Such a side 17 has either an inwardly sloping segment 18 and/or an offset stepped side 19 both from the larger surface 14 towards the smaller surface 16. In the particular embodiment disclosed in FIG. 1, the inner edge 20 of surface 14 closely follows the desired periphery 25 of coating 10. This mask surface 14 has a larger horizontal surface area than does surface 16. As side 17 connects surfaces 14 and 16 the side slopes in towards side 16. This slope is greater than 0° to less than 90° from the larger surface as the horizontal plane for at least a portion of that side to form an inner edge for this type of border mask. The edge is an inner edge for the mask because of the opening in the center or middle portion of the mask whereby the mask forms a border. The sloping side 17 can result from beveling of the side of the mask during fabrication to reduce said thickness between the first and the second surfaces.

The mask 12 of the present invention can be prepared by standard machining and fabrication techniques known to those skilled in the art for machining and fabricating parts from stock materials. A variety of materials suitable for preparing the masks include, for example, metal such as steel, like stainless steel, copper, aluminum; plastics such as polycarbonate and fluorinated ethylene-propylene (FEP) or a combination of both and fiber reinforced plastics like glass fiber reinforced nylon or polyphenylenesulfides and other high temperature plastics. In selecting materials for the mask 12 care must be taken to avoid materials that would adversely affect the coating operation. More particularly, in an MSVD coating system, the coating layers can be deposited on the glass sheet G while in the vacuum chamber and under high temperatures. When in the vacuum chamber, gases may be drawn out of the mask materials, typically referred to as "outgassing", which may affect the coating and result in a nonuniform and/or nonfunctional coating 10. In a situation where the periphery 25 of a coating 10 which is applied under high temperature conditions, will be visible to an observer, e.g. when the coating edge 25 is not obscured by other material on the surface of the substrate G such as a ceramic paint band, or covered by windshield attachment hardware and/or decorative molding, stainless steel is preferred. Most preferably 304 stainless steel is preferred because its coefficient of thermal expansion more closely matches that of the glass substrate. With the other materials, the mismatch of the coefficient can result in movement of edge 20 of mask 12 relative to the substrate G. This movement affects the uniformity of the coating 10 about its periphery 25 so that there is not a clean edge. In addition, the weight of the stainless steel keeps edge 20 flush against the surface of substrate G. For a mask of FIG. 1, the size and shape of such a mask assists in securing placement of the mask on the substrate. Generally the thickness of the mask is in the range of about 0.01 to about 0.5 inch (0.025 to 1.27 cm.) to maintain rigidity of the mask and preferably from about 0.06 to about 0.125 inch (0.15 to 0.32 cm.).

Figure 2:
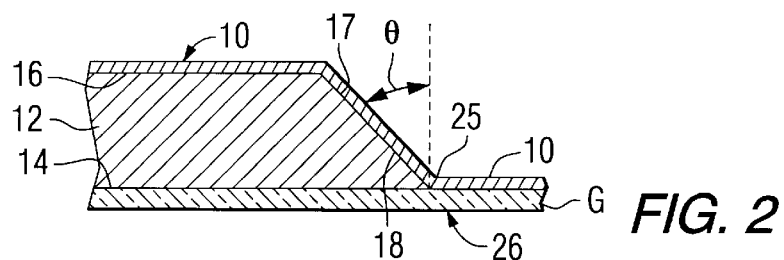
FIG. 2 is a partial cross-sectional view taken along line 2—2 of FIG. 1 incorporating the features of the present invention.
Figure 3:
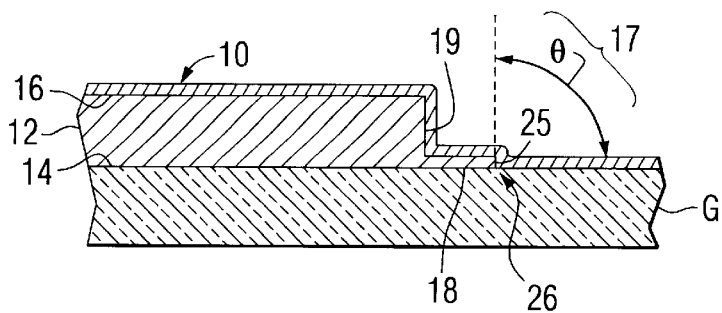
FIG. 3 is a partial cross-sectional view similar to that of FIG. 2 incorporating features of an alternative embodiment of the present invention.
Figure 4:
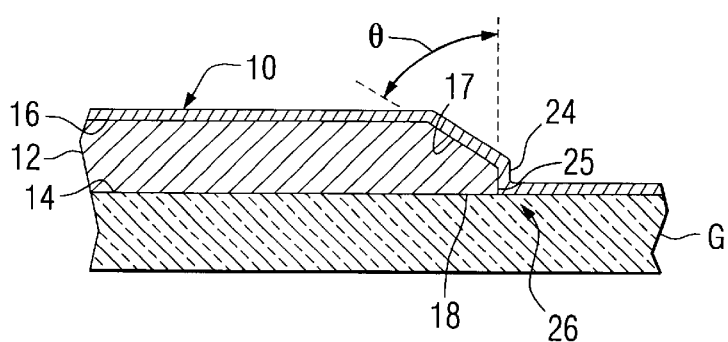
FIG. 4 is a partial cross-sectional view similar to that of FIG. 2 incorporating features of another alternative embodiment of the present invention.

The thickness of mask 12 at edge 20 can affect the appearance of the periphery 25 of coating 10 as shown in FIGS. 2–4. More specifically and in particular with physical vapor deposition techniques such as an MSVD coating operation, the thickness of the coating 10 is reduced in the area 26 immediately adjacent the edge 20 due in part to coating material, which would normally be deposited on the glass in area 26, instead being shaded by side 17 of mask 12 and deposited on mask 12. The shading of area 26 by side 17, which is referred to as "ghosting", results in a change in the coating 10 appearance about its periphery 25. This condition is particularly important where the periphery 25 of the coating 10 is visible in the final product as discussed above where it is desirable not to highlight the coating periphery. As a result, the width of area 26 is preferably minimized. In particular, it is preferred that the width of area 26 as the ghost line thickness be no greater than 0.005 inches (0.127 mm) and more preferably no greater than 0.0025 inches (0.0635 mm).

To correlate the relationship between the thickness of mask 12 along edge 20 and the width of area 26, tests can be performed using various inwardly sloped contours for segments 18 and/or 19 along with thicknesses for the mask 12 in applying one or more coatings to a substrate of the coating types disclosed in U.S. Pat. No. 4,898,789 and applied by an MSVD operation. For instance the width of area 26 should narrow as the thickness of edge 20 decreases. In particular, with an edge 20 thickness of 0.03 inches (0.762 mm) the width of area 26 should be approximately 0.005 inches (0.127 mm) and at an edge 20 thickness of 0.01 inches (0.254 mm) and less then the ghost width in area 26 should be no greater than approximately 0.003 inches (0.762 mm).

FIG. 2 shows a knife-edge version of the inwardly sloping segment 18 for side 17 of the mask 12 of the present invention. Here the inwardly sloping segment 18 results in the absence of material beyond the line of side 17 which has an angle to the normal of the larger surface 14 for the mask 12 of any degree less than 90°. For such an angle theta ("θ") i.e. closer to 90°, the mask 12 should be thinner to reduce the ghosting effect. For θ angles approaching 1 or less for the inwardly sloping segment 18 of side 17 of the mask 12, the distance between the larger surface 14 and smaller surface 16 can be greater. The inwardly sloping side 17 can have any contour such that material from a square edge is removed to the inwardly sloping side to form a θ angle with the vertical or normal to the larger surface 14.

A variation shown in FIG. 3 has material removed from the mask to form side 17 such that little if any material for mask 12 extends beyond the θ angle which in this case would be 90°. Also mask material from side 17 would not extend beyond the inwardly sloping side which has an angle approaching 0 to the horizontal at the mask coating interface. FIG. 4 shows another embodiment of the inwardly sloping side 17 where the segment 18 is a blunted knife edge so that the inwardly sloping portion does not begin at the larger surface 14 but begins a distance from that surface so that side 17 has a portion which is not inwardly sloping but is perpendicular to larger surface 14. This distance before the beginning of the inwardly sloping segment 18 of the side 17 preferably is not greater than 0.03 of an inch (0.076 cm). Also the θ angle is preferably around 40–70° so that the angle of the inwardly sloping segment 18 of side 17 to the horizontal is around 30–50° and most preferably 30°. The theta angle is preferably 80–60° and most preferably 70°. For FIG. 4 the inordinately sloping segment 18 of side 17 starts after another section of side 17 extends perpendicular from the larger surface 14. This perpendicular segment 24 as mentioned above should not be greater than 0.03 inch (0.76 mm). This thickness is important since the ghosting effect is proportional to the thickness of the mask at the glass-mask coating interface which is indicated as area numeral 26 in FIG. 4.

FIG. 5 shows a mask which can be an independent or localized mask as opposed to the border type mask of FIG. 1. Although it is possible that the mask of FIG. 5 is connected to the mask of FIG. 1, where the deletion shape or area is just slightly removed from the border. In this case the deletion mask which would otherwise be a local type mask is connected to the border mask, for instance, along one side of the localized mask to have a one piece mask for both the border area and the localized area. The independent or localized type mask 12 of FIG. 5 is independent in terms of its location on the surface of the transparency which could be anywhere, for instance, within the coating area 10 of FIG. 1. Preferably the localized masks have edge 20 which is an outer edge for the mask 12. Also it is most preferred that the localized one piece mask 12 with the outer edge 20 is essentially free of any openings so that the mask deletes the coating from the substrate according to the shape of surface 16 and side or sides 17. Once the mask 12 of FIG. 5 is placed on the transparency surface, it should be secure in its placement throughout the coating process. Movement or slippage or rotation of the mask 12 would produce a blurred coating deletion line. The larger surface 14 of the mask of FIG. 5 and the smaller surface 16 are separated by a single continuous side 17 due to the oval shape of mask 12 of FIG. 5. Of course depending on the shape of the mask, the side between the two major surfaces can have bends and/or contours and can even be concave or convex. The inwardly sloping segment 18 of side 17 could be similar to that of the inwardly sloping segment 18 of side 17 for FIG. 1 as shown in FIGS. 2–4.

FIG. 6 is the cross-sectional view taken along line 3—3 of FIG. 5. For larger and heavier masks like that of FIG. 1, the size and weight alone may be sufficient for secure placement of the mask on the substrate. For smaller and/or lighter masks secure placement on the substrate is assisted by the presence of one or more friction enhancing members ("FEMs") on the larger surface 14. As shown in FIG. 6, the localized mask preferably has three, 34, 36, and 38, FEMs at three different locations to securely place mask 12 of FIG. 5 on a transparency. There can be any number of FEMs that are effective to secure the mask to the transparency during coating even on larger and/or heavier masks as in FIG. 1. It is preferred to adhesively attach the FEMs to the mask. A suitable adhesive can be tape such as any adhesive tape which has a surface away from its adhesive side that increases the coefficient of friction between the mask 12 of FIG. 6 and a transparency like that of the transparency G of FIG. 1. Generally the thickness of the FEMs can range from 0.05 inch (0.127 cm) to 0.15 inch (0.381 cm.), preferably 0.06 to 0.12 inch (0.154 to 0.305 cm) thick for a mask 12 that is made of stainless steel and a little thicker for masks made of aluminum. Also if the larger surface 14 of the mask 12 has recesses to accommodate the FEMs then thicker FEMs can be used. Suitable FEMs include electrical tape available from 3M such as Scotch Super 33 Plus electrical tape 0.0033 inch (0.008 cm.) thick, Super 88 electrical tape 0.0088 inch (0.02 cm) thick, and Scotch 35 electrical tape 0.0035 inch (0.0089 cm.). Preferably the FEMs provide for a rotation tolerance of the mask on the transparency during coating of less than plus or minus 15°, most preferably plus or minus 10°. It is also possible to have such FEMs on the mask 12 of FIG. 1.

Preferably mask 12 as in FIG. 6 has recesses located on the smaller surface 16 to match FEMs of another mask so the masks can be stacked when they are not used for masking coatings. The recesses 28, 30 and 32 have dimensions which approximate the shape, contour, and size of the FEM such as tape. In stacking the masks of FIGS. 5 and 6, the recesses 28, 30 and 32 accommodate the placement within them of FEMs 34, 36, and 38 of another mask stacked on top of the mask 12. With the recesses of surface 16 slightly larger than the FEMs, the FEMs of a top mask do not contact the mask on which it is stacked. For instance the depth of the recesses 42 is preferably dimensionally greater than the height of the FEM 40 with which the recess is matched. This minimizes contact between the FEMs and the surface 16 of another mask in stacking. Most preferably the recesses have a depth of 0.02 inch (0.051 cm.) from the top of surface 16. In this way the larger surface 14 of the stacked mask rests on the smaller surface 16 of the mask on which it is stacked. These recesses and the FEMs can have a width ranging from less than 1 inch to around 3 inches (less than 2.54 to around 7.62 cm.) or more, preferably around 1 to 2.5 inches (2.54 to 6.35 cm.) for secure placement of mask 12 of FIG. 5 on a transparency for coating. Preferably the number of recesses in the smaller surface 16 are 3. Although the recesses and the FEMs as shown are transverse to the longitudinal axis of mask 12, both the recesses and FEMs can also be along matching locations on the longitudinal axis on the surface 14. Additionally any number of FEMs from 1 to 4 or more can be used with the same number of recesses or a smaller number of larger recesses.

Optionally and preferably the smaller surface 16 which is exposed to the coating and is subsequently coated during the coating process has a roughened surface. This roughening can be performed by any method known to those skilled in the art such as sandblasting or belt sanding or any type of grinding to a rough surface preferably approximating a grit of less than or equal to 36 although approximations to grit larger than 36 can also be used. For instance, the roughness of surface 16 could be around 80 grit. The purpose of the roughened surface of 16 is to provide better adhesion of the coating that is deposited on the mask for easier removal of the mask from the coated transparency without adversely disturbing the coating on the transparency. Even though surface 16 is preferably roughened, the larger surface 14 is preferably flat and smooth except for the presence of the FEMS. Preferably the flatness tolerance for surface 14 of the mask is plus or minus 0.005 inch (0.0127 cm.).

The cross-sectional side view of FIG. 6 of mask 12 shows the inwardly sloping segment 18 of side 17 for mask 12, where the side 17 ends at the recesses 28 and 32, respectively. The mask can have a blunt edge as shown in FIG. 4 at 24 of 0.01 inch (0.0254 cm.). The most preferred thickness for the stainless steel mask of FIG. 5 is one having a thickness 0.12 inch (0.3 cm.) which also has the inwardly sloping edge as a razor type edge. Preferably the inwardly sloping segment 18 of side 17 is a chamfer at 60° to a knife edge 20 of 0.09 inch to 0.005 inch (0.22 to 0.0127 cm). The smaller surface 16 of mask 12 preferably has the extending sections above the horizontal plane of the bottom of any recesses which can provide for some manner of picking up the mask from the coated transparency. Also, one or more of the masks 12 of FIG. 5 could be placed on the transparency to be coated as in FIG. 1 prior to coating to provide a number of deletions in coating 10.

The masks of the present invention are used to delete coating from a substrate preferably in a mass production operation. In such an operation the substrate is covered with one or more of the above-described masks, for instance a border type mask to delete coating from the peripheral areas of the substrate and/or one or more independent type masks to delete one or more coatings on certain portions of the substrate. The substrate is coated as it moves through a coater usually with a plurality of other covered or masked substrates one after the other. This general movement of substrates to be coated in a coater is well known to those skilled in the art. After the coating operation, the mask or masks are removed from the coated substrate. Either before removal of the mask or after, the coated substrate can be treated, for instance by heating, to render the coating more permanent on the substrate to avoid abrasion of the coating in handling.

It is preferred to reuse the removed masks on additional substrates to be coated. A preferred way of doing this is to stack the masks that are removed from the coated substrates.

For instance, automatic equipment with suction cups can remove the masks from the coated substrate and place them in a stack one mask on top of another to form a plurality of masks in the stack. The stack can be conveyed to the beginning of the coating line so that one or more masks can be applied to other substrates to be coated. In the process of using the masks of the present invention after the masks are used in a number of cycles of covering the substrate during coating of the substrate and removing the mask from the coated substrate, and repositioning the mask on other substrates for coating, the masks can be cleaned. Cleaning removes deposited coating usually from surface 16 which is exposed to the coating and actually masks the substrate from receiving the coating. Suitable methods of cleaning include abrasive techniques known to those skilled in the art for removing coatings from substrates and also chemical cleaning, for instance with acids, to dissolve the coating from the substrate. Since the masks of the present invention have a single piece edge, there is no separation caused by the chemical cleaning that may result in a double-edged mask. The masks of the present invention can then be redeployed for the coating of additional substrates.

As an alternative to cleaning the masks the deposited coating on the mask can be removed by removing a skin or surface that is placed on the mask as a fabric or as a coating. In essence a mask on a mask approach. An example would be a coating similar to a transient coating used on automobiles when they are shipped from the manufacturer to the distributor. Another suitable example is a fabric such as Teslin material available from PPG Industries, Inc. that is cut and applied on the smaller surface of the mask.

We claim:

1. A reusable, mask having rigidity and with a single-piece edge, to prevent selected portions of a substrate from being coated with a coating so as to provide a desired coating shape including any deletions of the coating on said substrate where ghosting along an edge of said coating is reduced, comprising:

one major surface having a horizontal surface area, another major surface opposing the first side having a larger horizontal surface area than the first surface wherein at least the surface with the larger surface area for the mask has the configuration of the shape of the desired deletion of the coating on a substrate to inhibit the deposition of the coating on the substrate;

one or more sides between the first and the second major surfaces arranged with one or more segments that slope inwardly from the surface with the larger surface area to the surface with the smaller surface area, wherein the slope is greater than 0° up to 90° to form an edge for the mask;

at least one friction enhancing member associated with the major surface with the larger surface area so that the mask is adapted for contact with a substrate to be coated through the at least one friction enhancing member.

2. Reusable mask of claim 1 wherein the mask is essentially free of openings and the edge that is formed is an outer edge for the mask.

3. Reusable mask of claim 2 wherein the mask has an oval shape and the side is continuous around the mask and the major surface with the larger surface area has three friction enhancing members and the surface with the smaller surface area has three matching recesses.

4. The mask as in claim 1 that has a thickness in the range of about 0.01 to about 0.5 inch to maintain rigidity of the mask.

5. The mask as in claim 4 wherein the thickness of the mask is in the range of about 0.06 to about 0.125 inch.

6. The mask as in claim 1 that is made from material selected from the group consisting of: stainless steel, aluminum, copper, and plastic and fiber reinforced plastic.

7. The mask as in claim 1 wherein said inwardly sloping side segment forms an edge portion that is no greater than 0.030 inch.

8. The mask as in claim 1 wherein said friction enhancing member is tape adhesively attached to the larger surface.

9. Reusable mask of claim 1 which includes at least one recess in the major surface with the smaller horizontal surface area where the number of recesses at least matches the number of friction enhancing members for the mask where each recess is adapted to receive a friction enhancing member from the larger surface area surface of another mask when the second mask is stacked on the first mask.

10. The mask as in claim 9 wherein said major surface with the smaller horizontal surface area with at least one recess has the recess transverse to the longitudinal axis of the mask.

11. The mask as in claim 10 wherein said major surface with the smaller horizontal surface area has three recesses transverse to the longitudinal axis of the mask where each end of the surface has a recess and an additional recess is located between these two recesses and the larger surface has three separate friction enhancing members transversely mounted each opposite one of the recesses of the opposite surface.

12. The mask as in claim 1 wherein said major surface with the smaller horizontal surface area has an altered surface to enhance the adherence of the coating to this surface of the mask.

13. The mask as in claim 12 wherein the altered surface results from abrading, acid etching or chemical treatment.

14. The mask as in claim 1 wherein the sloping side starts at a distance along the side between the first and second surfaces a distance from the larger surface.

15. The mask as in claim 1 wherein the substrate has an area of at least 10 square inches and is a material selected from the group consisting of: transparencies, glass, plastic, glass plastic laminates, plastic laminates, and coated plastics.

16. The mask as in claim 1, wherein said coating is a transparent coating.

17. The mask as in claim 1, wherein said sloping side results from beveling to reduce said thickness between the first and the second surfaces.

18. The mask as in claim 1 which is a one-piece mask.

19. A method of applying a coating to a substrate wherein less than all of the substrate is to be coated and where ghosting along peripheral edges of said coating is reduced, comprising:

covering said selected portions of said substrate with a semi-rigid mask having:

one major surface having a horizontal surface area, another major surface opposing the first side having a larger horizontal surface area than the first surface wherein at least the surface with the larger surface area for the mask has the configuration of the shape of the desired deletion of the coating on a substrate to inhibit the deposition of the coating on the substrate;

one or more sides between the first and the second major surfaces arranged with one or more segments that slope inwardly from the surface with the larger surface area to the surface with the smaller surface area, wherein the slope is greater than 0° up to 900 to form a single-piece edge for the mask;

at least one friction enhancing member associated with the major surface with the larger surface area so that the mask is adapted for contact with a substrate to be coated through the at least one friction enhancing member, coating said masked substrate with at least one coating, removing the mask from the coated substrate; and reusing the one or more of the now coated masks on other substrates to be coated at least one mask per substrate.

20. The method of claim 19, which includes cleaning one or more coated masks after several cycles of applying at least one coating.

21. The method of claim 20, wherein the cleaning is selected from the group consisting of: abrasion, acid cleaning, basic cleaning, solvent cleaning, and removal of a protective film from the mask.

22. The method of claim 21, which includes stacking a plurality of the coated masks removed from the coated substrate and conveying the stack to reuse the masks, wherein the masks have at least one recess of the size and shape to accommodate the at least one friction enhancing member of another mask when this other mask is stacked on the first mask at the smaller surface.

* * * * *